United States Patent
Ferreira et al.

(10) Patent No.: US 6,797,597 B2
(45) Date of Patent: Sep. 28, 2004

(54) PROCESS FOR TREATING COMPLEMENTARY REGIONS OF THE SURFACE OF A SUBSTRATE AND SEMICONDUCTOR PRODUCT OBTAINED BY THIS PROCESS

(75) Inventors: Paul Ferreira, Goucelin (FR); Phillipe Coronel, Barraux (FR)

(73) Assignee: STMicroelectronics S.A., Montrouge (FR)

(*) Notice: Subject to any disclaimer, the term of this patent is extended or adjusted under 35 U.S.C. 154(b) by 82 days.

(21) Appl. No.: 10/176,386

(22) Filed: Jun. 20, 2002

(65) Prior Publication Data

US 2003/0016571 A1 Jan. 23, 2003

(30) Foreign Application Priority Data

Jun. 21, 2001 (FR) .............................. 0108192

(51) Int. Cl.[7] .................... H01L 21/22; H01L 21/38
(52) U.S. Cl. ................... 438/546; 438/548; 438/551; 438/735
(58) Field of Search ............... 438/527, 522, 438/529, 530, 545, 546, 547, 548, 549, 550, 551, 659, 689, 706, 738, 734, 735, 745, 914

(56) References Cited

U.S. PATENT DOCUMENTS

| | | | |
|---|---|---|---|
| 5,141,882 A | * | 8/1992 | Komori et al. ............. 438/450 |
| 5,278,085 A | * | 1/1994 | Maddox, III et al. ........ 438/224 |
| 5,413,944 A | * | 5/1995 | Lee .............................. 438/228 |
| 5,460,984 A | * | 10/1995 | Yoshida ....................... 438/401 |
| 5,559,045 A | * | 9/1996 | Yamamoto .................. 438/268 |

OTHER PUBLICATIONS

Preliminary Search Report dated Mar. 6, 2002 for French Application No. 0108192.

* cited by examiner

Primary Examiner—David Nhu
(74) Attorney, Agent, or Firm—Lisa K. Jorgenson; Jon A. Gibbons; Fleit, Kain, Gibbons, Gutman, Bongini & Bianco P.L.

(57) ABSTRACT

The invention relates to a process for treating a portion of the surface of a substrate according to a first and second surface treatments which are different from each other and are intended respectively for a first group of regions and for a second group of regions of the surface portion, the two groups of regions being mutually complementary with respect to the surface portion, the process making it possible to use only a single operation of positioning a mask which differentiates the regions of the first and second groups of regions, using the same protective materials for the regions of each group of regions against the effects of the treatment intended for the regions of the other group of regions. Application to the fabrication of semiconductor products.

15 Claims, 4 Drawing Sheets

PROCESS FOR TREATING COMPLEMENTARY REGIONS OF THE SURFACE OF A SUBSTRATE AND SEMICONDUCTOR PRODUCT OBTAINED BY THIS PROCESS

CROSS REFERENCE TO RELATED APPLICATIONS

This application is based upon and claims priority from prior French Patent Application No. 0108192, filed Jun. 21, 2001, the disclosure of which is hereby incorporated by reference in its entirety.

BACKGROUND OF THE INVENTION

1. Field of the Invention

The present invention generally relates to a process for treating complementary regions of the surface of a substrate and to a semiconductor product thus obtained by this process. More particularly, the present invention the field of fabricating semiconductor products and its applications lie in particular in the treatment of substrates by different treatment steps on complementary regions of their surfaces.

2. Description of Related Art

The term "substrate" is used to denote a support, which has possibly already received various treatments of varied kinds and intended to receive at least one additional treatment. The surface of this support is in general plane or approximately plane in order to be able to use the usual treatment tools and methods for plane surfaces in the field of the fabrication of semiconductor products. These tools and methods possibly being adapted in the case of surfaces which are not strictly plane, for example using devices for the development of a cylindrical surface.

The term "semiconductor product" is used to denote a substrate intended in its final application to support electronic components. This is therefore in general a semi-finished product appearing in the course of the fabrication of a number of components carried by a single support.

The surface treatments considered by the invention may be of very varied kinds, for example implantation of atomic or ionic species, deposition of chemical species, etching, treatment of the surface using a physical principle, especially by bombardment or irradiation, surface treatment according to a chemical principle, especially by surface reaction or by sensitization, and more. The feature of the surface treatments relating to the invention is the need for direct access to the region of the surface to be treated, possibly access by exposure of this exposed region, access by contact, especially for contacting with a liquid solution, and other surface treatments. One particularly widely used surface treatment is the implantation of arsenic or phosphorus into a silicon substrate in order to impart n-type semiconductor behavior on it, or the implantation of boron or boron fluoride in order to impart p-type semiconductor behavior on it. More generally, the two surface treatments of the regions of the first group of regions and of the second group of regions are, respectively, two treatments of the substrate by implantation of atomic or ionic species so as to create two different dopings.

As a matter of fact, in the above technical field, it is frequently the case to have to apply different treatments to complementary regions of the surface of a substrate. This occurs when a first group of regions has to receive a first surface treatment, while a second group of regions has to receive a second surface treatment, without the first or the second regions being subjected to the effects of the surface treatment intended for the other region.

The expression "groups of complementary regions with respect to the surface portion of the substrate" is understood to mean that this surface portion is divided into two groups of regions so that joining the regions of these two groups of regions reconstitutes the initial surface portion of the substrate in its entirety and without any overlap of parts of regions. The selective exposure of the regions of a group of regions to a surface treatment which is intended for it without the regions of the other group of regions being subjected to the effects of this surface treatment requires placing, on the latter regions, one or more screen layers capable of blocking the effects of the treatment on the substrate surface thus protected. Since the two groups of regions have to receive a respective surface treatment exclusively with respect to the regions of the other group of regions, two steps of depositing screen layers are necessary, successively on the regions of each of the two groups of regions, before the surface treatment intended for this group of regions is applied.

These screen layers must therefore leave exposed the regions that have to receive the effects of the surface treatment which is intended for them. Their depositions must therefore be selective, this selectivity resulting from the use of respective specific masks, which differentiate the regions of one of the two groups of regions with respect to those of the other group of regions. Each mask is positioned with respect to the substrate with a precision of about 0.10 to 0.18 $\mu$m, using identification marks for aligning the mask with respect to the substrate, and with a procedure consisting of several repeated steps of progressively readjusting the position of the mask. According to the existing methods, these operations of positioning the mask are carried out during each deposition of the screen layers, that is to say at least twice in the case considered here of two different surface treatments applied to two groups of complementary regions of the substrate surface.

However, the imprecision in positioning the aforementioned masks prevents the regions of one group of regions being contiguous with regions of the other group of regions, that is to say there is a residual substrate band between the regions of each group of regions which is either not subjected to either the first or the second treatment, or is successively subjected to the effects of both surface treatments. This results, in the first case, in the formation of parts of the surface of the substrate which are not treated, and therefore lost from the standpoint of the fabrication of electronic circuits. Furthermore, a substrate band which is not treated by any of the two surface treatments is in an uncontrolled electrical state which may affect the subsequent operation of the electronic circuits. This is particularly so for a pure silicon substrate when the two surface treatments consist of implantations of doping species defining the electrical behavior of the implanted regions. In the second case, this results in the formation, between regions belonging to different groups of regions, of substrate bands receiving successively both surface treatments. Such regions are also deleterious, for the same reasons as those mentioned above, in particular in the aforementioned case of doping treatments of a pure silicon substrate. Accordingly, a need exists to overcome the problems of a "residual substrate band" and to provide a product and process with little or no "residual substrate band."

SUMMARY OF THE INVENTION

One object of the present invention is to provide a process which comprises the use of only a single mask for carrying out two different surface treatments intended for separate regions, and therefore comprising only a single operation of positioning the mask with respect to the substrate.

The invention relates more particularly to a process for treating a surface portion of a substrate comprising a first group of regions intended to receive a first surface treatment and a second group of regions intended to receive a second surface treatment different from the first surface treatment, the two groups of regions each comprising at least one region and being mutually complementary with respect to the surface portion, wherein:

a step of selectively protecting the regions of the second group of regions against the effects of the first surface treatment is carried out by the selective deposition of at least one layer formed from first materials on the regions, using a mask which differentiates the regions belonging to the first group of regions from the regions belonging to the second group of regions;

the first surface treatment is applied so that it has an effect only on the regions of the first group of regions;

a step of selectively protecting the regions of the first group of regions against the effects of the second surface treatment is carried out by the deposition on the surface portion of at least one layer formed from second materials and by selective removal of the layers for protecting the regions of the second group of regions against the effects of the first surface treatment so that protection layers remain only on the regions of the first group of regions, this selectivity being obtained by alternating the steps of removing these layers with the steps of depositing the materials causing the regions of the first group of regions to be protected against the effects of the second surface treatment; and the second surface treatment is applied so that it has an effect only on the regions of the second group of regions.

The fact of using only a single mask has the advantage of reducing the number of steps of the overall process and also of reducing the number of machines needed for this process, the cycle time and therefore the overall cost of this process.

This process may be continued using the same logic, on the basis of the initial differentiation between the two groups of regions, that is to say without reusing the mask for differentiating the regions of the two groups of regions, for the purpose of applying a third surface treatment to the regions of the first group of regions, and against the effects of which treatment the same protective materials as those already used provide effective protection of the substrate. Thus, protection of the regions of the second group of regions may be reconstructed from protection layers, while removing the protection layers from the regions of the first group of regions using the same removal steps alternating with the steps of depositing the protective materials on the regions of the second group of regions. The third surface treatment may therefore be applied so that it has an effect on the regions of the first group of regions. This sequence of steps may again be repeated without limit, in order to carry out surface treatments having an alternating effect on the regions of each of the two groups of regions without having an effect on the regions of the other group of regions, no loss of definition of the two groups of regions occurring during this sequence.

According to the process of the invention, the selective protection of the regions of each respective group of regions against the effects of the surface treatment intended for the regions of the other group of regions is obtained by at least one screen layer and at least one screen protection layer. These layers are obtained from respective materials which are deposited separately on the surface portion of the substrate. During the rest of the process, the screen layer forms, for the underlying region, a screen against the effects of the treatment intended for the regions of the other group of regions, and the screen protection layer protects the underlying screen layer against a process for removing the screen layer.

Advantageously, the screen protection layer used is also photosensitive and capable of being developed. It is therefore irradiated at the start of the process after the deposition of the materials causing the regions of the second group of regions to be protected against the effects of the first surface treatment, this irradiation being carried out using the mask which differentiates the regions of the first group of regions from the regions of the second group of regions. According to the invention, the subsequent depositions of screen protection layers no longer use irradiation and development steps to provide the selective protection of the regions of a group of regions, but this selectivity is obtained by using the protection layers already present on the regions of the other group of regions.

To do this, after application of the first surface treatment, the deposition of the new screen and screen protection layers is carried out during successive steps alternating with steps of selectively removing the layers for protecting the regions of the second group of regions against the effects of the first surface treatment.

This selective removal of the layers for protecting the regions of the second group of regions against the effects of the first surface treatment comprises at least one step of mechanical abrasion, or dry etching, or planarizing etching, or dissolution, or chemical etching.

This selective removal is controlled in its progressive advance towards the surface of the substrate with respect to the removal of the screen protection layer present above the regions of this second group of regions. Several methods are possible for this control; in particular, analysis of the material residues removed can provide, as identifying mark, a change of chemical composition of these residues by passing from one screen material layer at the end of removal to a screen protection layer starting to be removed, or vice versa.

According to another method of controlling the progress of the removal steps, the screen protection layers possess a first state or a different second state, the second state giving the screen protection layer the property of greater resistance to the process of removing the protection layers compared with the resistance of the screen layers to the removal process. The progress of the removal of the successive layers can then be monitored by timing, or else, in the case of removal by abrasion using a rotating disk, by monitoring the torque of this disk, this torque being greater when the abrasion relates to the screen protection layer.

In another embodiment, the residues produced during the mechanical polishing such as by a rotating disk are analyzed. The residue produced from the screen protection layer is chemically different than the residue produced from polishing the screen layer.

To do this, the screen protection layers pass from their first state to their second state by a treatment applied in situ. Since this treatment has the effect of "hardening" the material of this screen protection layer, it is preferably carried out after the removal of the material or materials constituting the screen protection layer from the regions that have to receive the effects of the next surface treatment.

The invention also relates to a process for obtaining a semiconductor product comprising steps of carrying out a process for treating a substrate, such as those described above.

Moreover, the invention relates to the semiconductor product treated or obtained according to the process of the invention or to this process for obtaining the product. Such a product therefore possesses contiguous regions that have undergone different respective treatments specific to each group of regions. In the case of implantation treatments, the contiguity of the regions thus treated may be revealed by elemental analysis and in the case of other treatments this contiguity may especially be observed by scanning electron microscopy. The formation of wells of opposite, p and n, doping types in contiguous and alternating regions arises especially in the fabrication of transistor memories requiring a large number of transistors produced on the same support with a maximum density. Other electronic components, such as processors, also benefit in their fabrication from the advantages of the present invention, especially so as to increase the manufacturing precision and the miniaturization of the circuits which contain them.

BRIEF DESCRIPTION OF THE DRAWINGS

The subject matter which is regarded as the invention is particularly pointed out and distinctly claimed in the claims at the conclusion of the specification. The foregoing and other features, and advantages of the invention will be apparent from the following detailed description taken in conjunction with the accompanying drawings.

DETAILED DESCRIPTION OF AN EMBODIMENT

Figure 1:
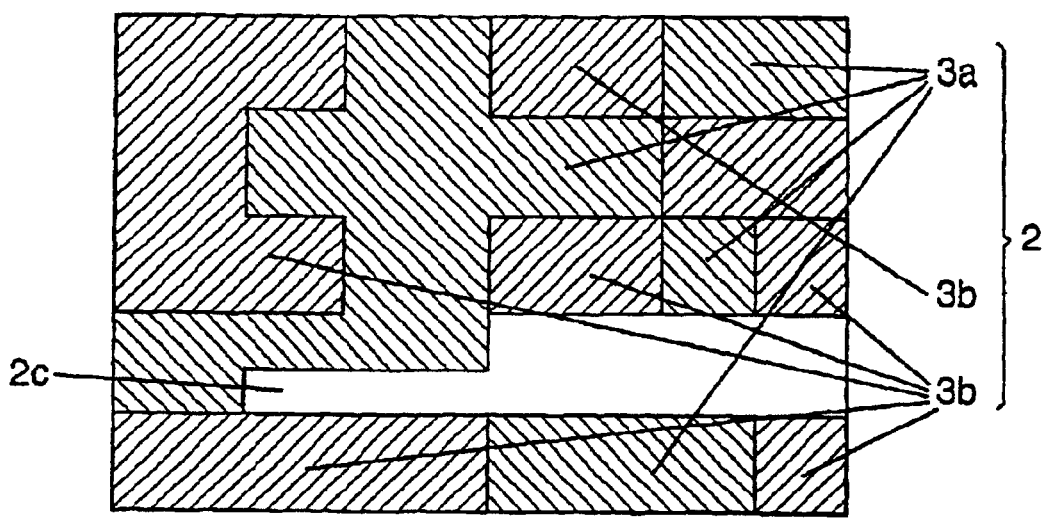
FIG. 1 is an example of the partition of a surface portion of a substrate into two groups of regions which are contiguous and complementary with respect to the surface portion, according to the present invention.

It should be understood that these embodiments are only examples of the many advantageous uses of the innovative teachings herein. In general, statements made in the specification of the present application do not necessarily limit any of the various claimed inventions. Moreover, some statements may apply to some inventive features but not to others. In general, unless otherwise indicated, singular elements may be in the plural and vice versa with no loss of generality. In the drawing like numerals refer to like parts through several views.

FIG. 1 shows a top view of a substrate 1 locally divided into two groups of respective regions 3a and 3b. The regions 3a are hatched in one direction so as to distinguish them from the regions 3b which are hatched in the other direction. The surface portion 2 of the substrate includes both regions 3a and 3b. These regions are intended to receive a first or a second surface treatment according to the process of the present invention. The surface portion 2 may not represent the entire surface of the substrate 1, so that a surface portion 2c, complementary to the surface portion 2 with respect to the entire surface of the substrate 1, must not receive either of the two surface treatments envisaged. A protective hard mask is then initially deposited on this surface portion 2c so as to protect it from the effects of all the treatments applied thereafter. It therefore does not matter whether the surface portion 2c thus protected is incorporated into the group of regions 3a or into the group of regions 3b, so that the regions 3a and 3b appear complementary with respect to the entire surface of the substrate 1. At the end of the process according to the present invention, the hard mask is removed from the surface portion 2c, which is therefore restored to its initial state.

Figure 2:
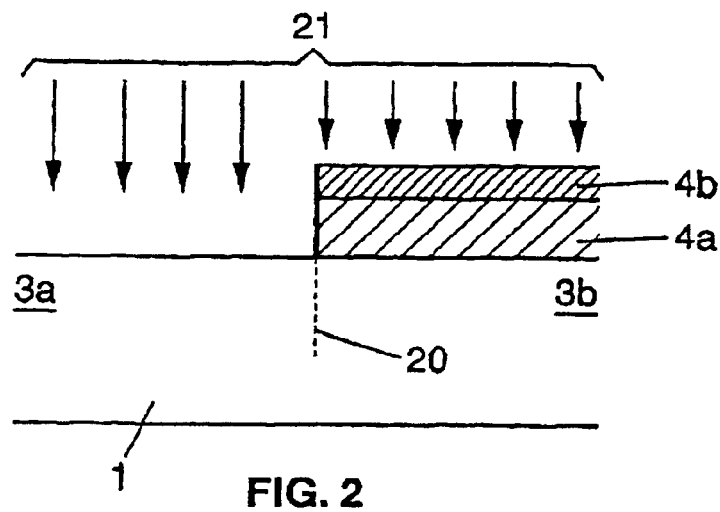
FIGS. 2 through 10 are sectional views of a substrate treated according to the process of the invention, as per the respective successive steps of the process.

In FIG. 2, the partition between two adjacent regions 3a and 3b is represented by a broken vertical line 20. The regions 3b are covered with a screen layer 4a and with a screen protection layer 4b. The screen layer has, for example, a thickness of approximately 1.5 $\mu$m and the screen protection layer has a thickness of approximately 0.3 $\mu$m.

In particular in the case described below, for the production of transistors on the surface of a silicon substrate, this substrate may have already received, using methods known by those skilled in the art, several treatment steps intended to deposit on its surface localized electrical insulation regions of about 0.5 $\mu$m in depth below the surface of this substrate and having dimensions parallel to this surface of around 0.3 $\mu$m, and to constitute a thin oxide layer over the entire portion of the substrate surface on which it is intended to form the transistors. To simplify matters, these localized regions and this oxide layer are not shown in the figures.

Figure 11:
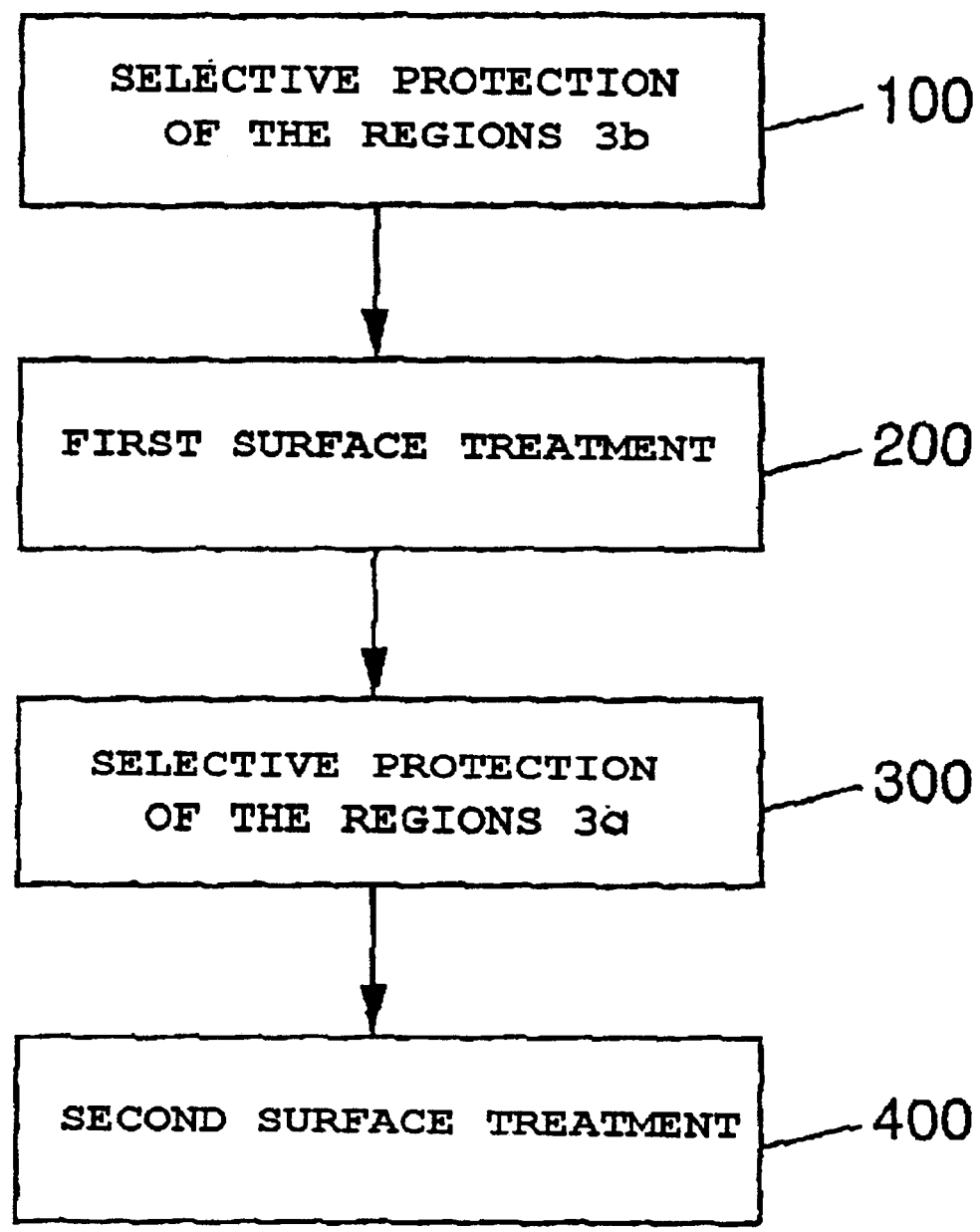
FIG. 11 is a diagram illustrating the steps of the process according to the invention.

The steps of the process according to the invention are illustrated in the diagram shown in FIG. 11.

In a first step 100, the regions 3b of the second group of regions are selectively protected against the effects of the first surface treatment.

This protection is obtained by the selective deposition, on the regions of the second group of regions, of the materials used for the screen layer 4a and the screen protection layer 4b, this deposition being carried out in a manner standard for those skilled in the art.

The screen layer is firstly formed by depositing over the entire surface portion 2 materials capable of protecting the covered regions against the effects of the first surface treatment. This deposition may be carried out on a spinning substrate (i.e. spin coating) receiving at its center a liquid solution which is a precursor of the material, or by immersing the substrate (i.e. dip coating) in a solution of the same type, or else by coating the substrate with reactants in a viscous or powdery form, followed by a scraping operation in order to control the thickness deposited. The deposition is then followed by a step of annealing the material thus deposited in order to solidify the screen layer 4a and possibly bring the material of which it is composed into the final chemical state providing the desired screen function during application of the first surface treatment. The screen protection layer 4b is then formed in a similar manner, by applying to the screen layer the materials corresponding to its composition and then carrying out a possible second annealing step so as to solidify it in turn.

The materials of the screen and screen protection layers are then selectively removed from the regions 3a of the first group of regions that have to undergo the first surface treatment. This selective removal is carried out by a standard method involving a photoresist. According to this method, the photoresist is firstly deposited on the screen protection layer. Then follow the steps of irradiating this photoresist through a correctly positioned mask, of developing the photoresist and of removing this photoresist, either in the regions exposed to the irradiation through the mask or in the regions hidden by the mask during the irradiation, depending on whether the photoresist is a positive or a negative photoresist. Finally, the screen and screen protection layers are removed from the regions in which they are not protected by the photoresist, so that there remain screen and screen protection layers, which are themselves covered with photoresist, only in the regions 3b of the second group of regions.

The step of positioning a mask differentiating the regions 3a of the first group of regions from the regions 3b of the second group of regions is consequently involved during deposition of the materials causing the regions of the second group of regions to be selectively protected. According to the present invention, this step is the only step using a mask that has to be positioned on the substrate, all the subsequent steps treating quite differently the regions of the two groups of regions resulting from this differentiation between the two groups of regions 3a and 3b initially achieved by means of this mask.

The irradiation of the photoresist is carried out in a manner tailored to the nature of the photoresist used. It may be irradiation by ultraviolet light of sufficient intensity and of suitable wavelength, taking into account the sensitivity of the photoresist, or bombardment by electrons sent onto the surface of the photoresist in the form of a beam scanning this surface. The method of developing the photoresist after irradiation also depends on the nature of the photoresist used. In particular, development by dissolving it in a specific liquid solution is most commonly used.

The EIRIS™ process, the components for which are sold by the company JSR (11-24 Tsukiji 2-Chome, Cho-Ku, Tokyo, 104 JAPAN), comprises the delivery of the materials used for the screen layer and the screen protection layer to be deposited on the substrate, together with the characteristics of the annealing treatments for each of these layers. This EIRIS™ process is cited for the purpose of illustrating the present invention, without in any way limiting it with respect to other processes involving at least two layers of resins, one of which is rich in silicon, and having the same functionalities as the EIRIS™ process. According to the operating instructions for the EIRIS™ process, the screen layer must especially be annealed at 170° C. for 120 s and the screen protection layer annealed at 120° C. for 60 s. In the particular case of the EIRIS™ process, the screen protection layer also fulfils the function of a photoresist, which is sensitive to irradiation at a wavelength of 365 nm (mid-UV) or at a higher energy wavelength of 248 nm (deep UV). A second annealing step for the screen protection layer is then necessary, called "post-exposure bake" in the aforementioned instructions, and this layer is then developed as for a positive photoresist, that is to say after development a screen protection layer only remains at the places where is has been irradiated. Within the context of the use of the EIRIS™ process, the mask differentiating the two groups of regions must therefore obscure the regions of the first group of regions from the irradiating light.

The screen protection layer thus formed is in its first state. It is then transformed by a reduced-pressure oxygen plasma treatment to which the entire surface of the substrate 1 is subjected. This treatment brings the screen protection layer into its second state, which is more resistant to the removal processes thanks to the formation within it of silica $SiO_2$ during this oxidizing plasma treatment.

The selective removal of the screen layer from the regions of the first group of regions is carried out simultaneously by the above oxygen plasma treatment. Because of the organic nature of this screen layer, of resin type, the oxygen plasma etches it at the same time as it transforms the screen protection layer into a material containing silica. By virtue of its specific resistance to this removal process, owing to the formation of silica, the screen protection layer fulfils the role of protecting the screen layer over the regions of the second group of regions during this removal step.

After this first step 100, the regions 3a of the surface portion 2 of the substrate of the first group of regions are exposed, while the regions 3b of the second group of regions are protected by the screen layer 4a covered with the screen protection layer 4b, as shown in FIG. 2.

The process then continues, in step 200, with the application of the first surface treatment over the entire surface portion 2 of the substrate, namely, for example, ion implantation 21 beneath the surface of this substrate so as to locally impart on it an n-type semiconductor behavior. It therefore has an effect on the substrate only in the regions 3a of the first group of regions, those regions 3b of the second group of regions being protected against the effects of this surface treatment by the previously applied screen layer 4a.

Figure 3:
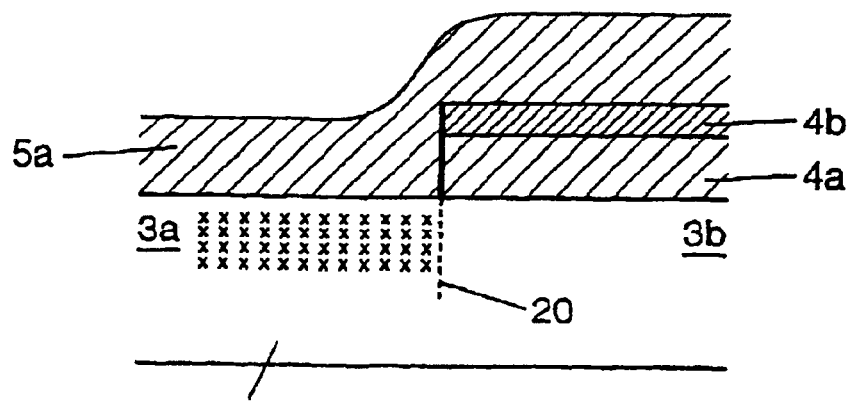

In step 300, the regions 3a of the first group of regions are then protected against the effects of the second surface treatment. In the particular example considered here, for the purpose of illustration, the materials for the EIRIS™ process are used a second time in order to protect the regions 3a. It will therefore be assumed that these materials are capable of providing effective protection against the effects of the second surface treatment, in addition to their effectiveness in protecting against the effects of the first surface treatment. This is one particular situation, but in general the screen layers 4a and 5a for protecting the regions 3a and 3b of each group must be different, these layers being tailored to each surface treatment relating to each of the two groups of regions. Consequently, the materials used for the screen layer are applied a second time over the entire surface portion 2 of the substrate by a method similar to that used in step 100. Thus, the configuration shown in FIG. 3 is obtained. A screen layer 5a, having a thickness of approximately 1.8–2.0 µm, is in direct contact with the surface of the substrate 1 in the regions 3a of the first group of regions and covers the screen protection layer 4b in the regions 3b of the second group of regions.

Figure 4:
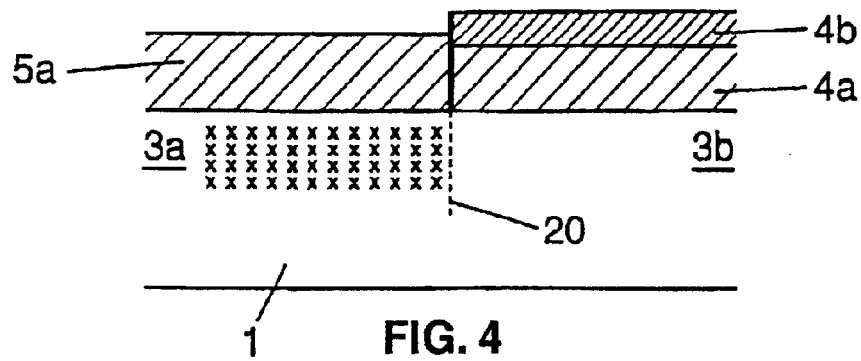

This second screen layer is then partially removed, for example by mechanical abrasion, so as to completely remove this new screen layer from the regions of the second group of regions. The configuration shown in FIG. 4 is then obtained.

Because of the difference in height of the screen layer 5a with respect to the surface of the substrate between the regions 3a and 3b of each group of regions, this screen layer 5a is completely removed from the regions 3b of the second group of regions, while a thickness of around 1.7 µm of this layer remains in the regions 3a of the first group of regions. To be precise, the surface of the screen layer 5a in the regions 3a of the first group of regions is slightly below the surface of the screen protection layer 4b in the regions 3b of the second group of regions. This arises from the lower resistance of the layer 5a to the abrasion carried out compared with the layer 4b.

This rotational mechanical abrasion is stopped and repeated when the applied torque needed to maintain a constant speed of rotation with the same abrasion pressure increases due to the greater frictional resistance of the screen protection layer 4b in the regions 3b of the second group of regions when the screen protection layer is exposed during the abrasion. The higher frictional and abrasion resistance property, in a ratio of 1:10, that the screen protection layer 4b has compared with the screen layer 5a comes from the oxidizing plasma treatment carried out in step 100 after its removal from the regions 3a of the first group of regions.

Any other technique for detecting the end of removal of the second screen layer 5a in the regions 3b may be used as an alternative. For example, when a certain proportion of the element silicon revealed by analysis of the polishing residues is detected, this indicates that the abrasion level has reached the screen protection layer 4b in the regions 3b.

Figure 5:
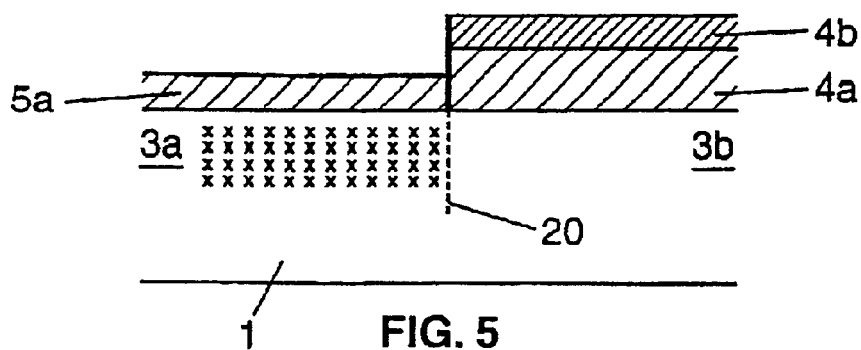

The mechanical abrasion is in general continued slightly further (over polishing) so as to increase, thanks to the difference in abrasion rate, the difference in height between the upper surface of the screen layer 5b in the regions 3a of the first group of regions and the upper surface, lying at a higher level, of the screen protection layer 4b in the regions 3b of the second group of regions. Thus, the configuration in FIG. 5 is obtained, in which the surface of the screen layer 5a in the regions 3a of the first group of regions is brought to a lower height than that of the interface between the screen layer 4a and the screen protection layer 4b which are above the regions 3b of the second group of regions.

Figure 6:
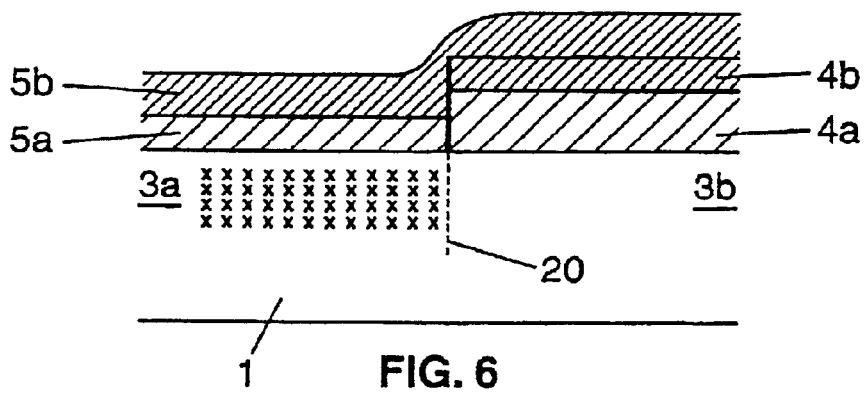

The materials used for the screen protection layer are then again deposited as a layer 5b over the entire surface portion of the substrate to be treated using a procedure similar to that already used in step 100, so as to end up with a configuration of this surface as shown in FIG. 6.

Figure 7:
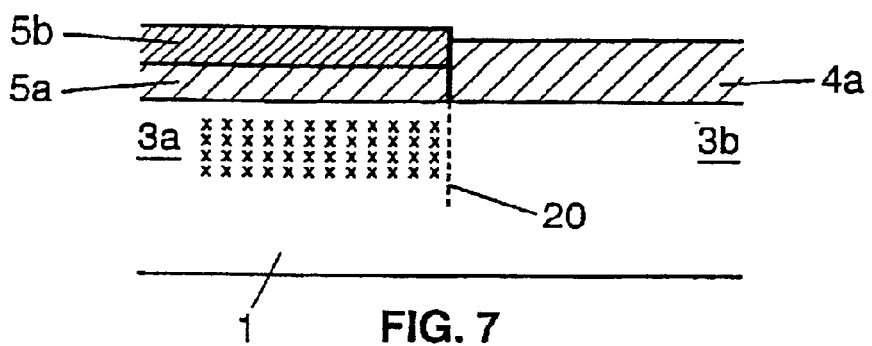

A mechanical abrasion step is then again carried out over the entire surface portion 2 of the substrate to be treated so as to entirely remove the screen protection materials 5b from the regions 3b of the second group of regions. This abrasion is stopped when the screen layer 4a is exposed in these regions 3b. The configuration shown in FIG. 7 is therefore obtained. Since the upper surface of the screen layer 5a in the regions 3a of the first group of regions had been lowered during the first mechanical abrasion step to below the level of the lower surface of the screen protection layer 4b in the regions 3b of the second group of regions, there therefore remains a significant thickness of screen protection materials 5b above the screen layer 5a in the regions 3a of the first group of regions.

Using a reduced-pressure oxidizing plasma treatment identical to that already carried out, the screen protection layer 5b present in the regions 3a of the first group of regions is then brought into its second state, which gives it greater abrasion resistance.

Figure 8:
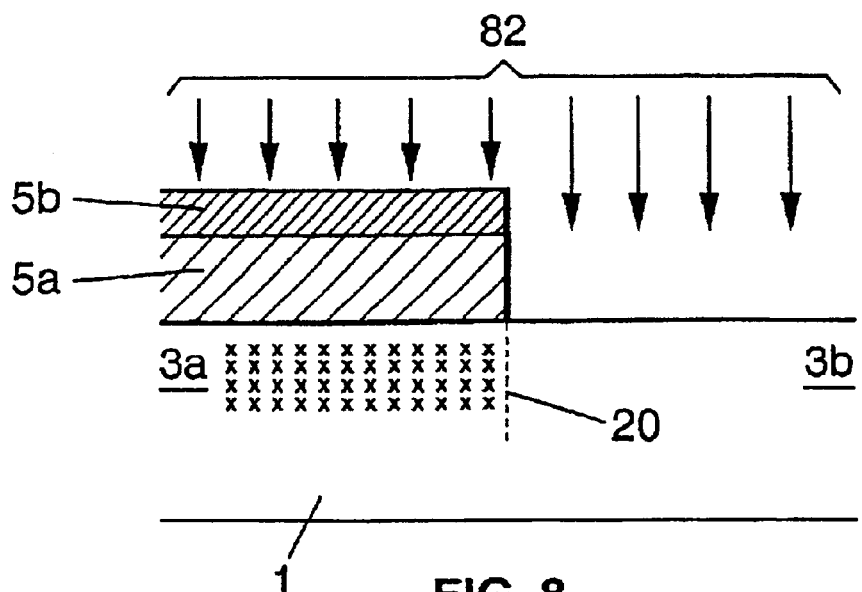

Simultaneously, the screen protection layer 4b present in the regions 3b of the second group of regions is removed by this oxidizing plasma treatment. After this step, the regions 3b of the surface portion of the substrate of the second group of regions are exposed, whereas the regions 3a of the first group of regions are protected by the screen layer 5a covered with the screen protection layer 5b, as in the configuration shown in FIG. 8.

Figure 9:
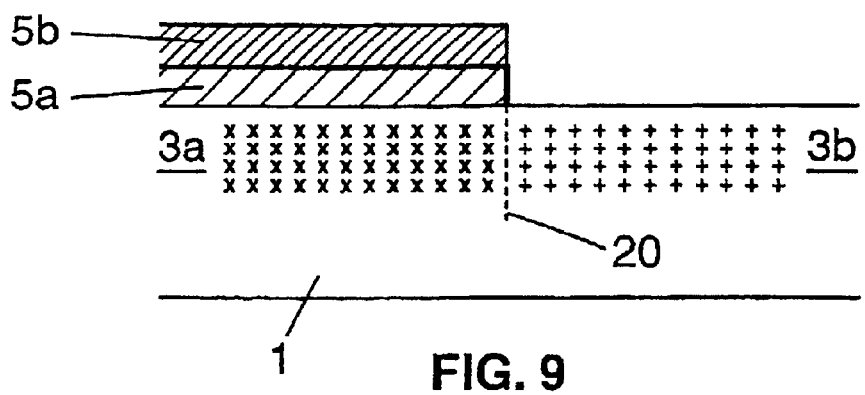

In step 400, the second surface treatment is then applied to the entire surface portion 2 of the substrate, namely for example an ion implantation 82 beneath the surface of this substrate so as to give it locally a p-type semiconductor behavior. This therefore has an effect on the substrate, as shown in FIG. 9, only in the regions 3b of the second group of regions, the regions 3a of the first group of regions being protected against the effects of this surface treatment by the previously applied screen layer 5a.

The process may then be continued iteratively, by alternately treating the regions of the first and second groups of regions while still protecting, for each treatment, the regions of the other group of regions.

Figure 10:
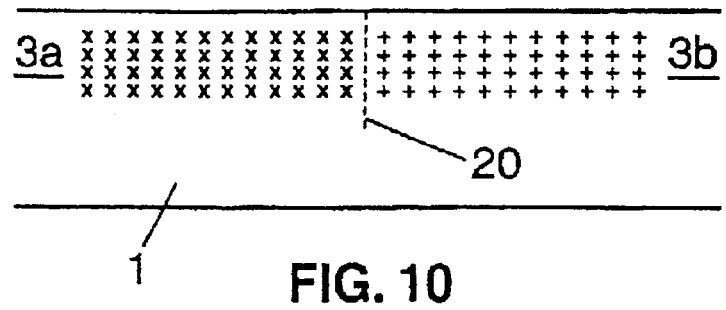

At the end of the process, or after the second surface treatment, a mechanical abrasion step is used to remove the screen protection layer 5b present above the regions 3a of the first group of regions and is continued until it exposes the screen layer 5a present in these regions. The screen layer 5a is then in turn removed by one of the processes already used for removing the screen layers, namely dissolution, chemical etching or dry plasma etching. The surface of the substrate is then laid bare, as illustrated in FIG. 10, and has, in the regions 3a and 3b of the surface portion 2, properties which depend on the nature of the ion implantation of the corresponding group of regions, namely, in the example, n-type doping and p-type doping respectively.

Although a specific embodiment of the invention has been disclosed, it will be understood by those having skill in the art that changes can be made to this specific embodiment without departing from the spirit and scope of the invention. The scope of the invention is not to be restricted, therefore, to the specific embodiment, and it is intended that the appended claims cover any and all such applications, modifications, and embodiments within the scope of the present invention.

What is claimed is:

1. A process for treating a surface portion of a substrate comprising a first group of regions intended to receive a first surface treatment and a second group of regions intended to receive a second surface treatment different from the first surface treatment, the two groups of regions each comprising at least one region and being mutually complementary with respect to the surface portion, the process comprising:

forming a mask, which differentiates a first group of regions from a second group of regions on a substrate;

depositing, using the mask, at least one first screen layer formed from first materials deposited on the one or more regions of the second group of regions so as to selectively protect one or more regions of the second group of regions from a first surface treatment;

applying the first surface treatment to the one or more regions of the first group of regions;

depositing at least one second screen layer formed from second materials over both the one or more regions of the first group of regions and the one or more regions of the second group of regions to selectively protect one or more regions of the first group of regions against the affects of a second surface treatment;

selectively removing the at least one first screen layer and the at least one second screen layer from the one or more regions of the second group of regions; and applying the second surface treatment on the one or more regions of the second group of regions;

wherein the depositing, using a mask, at least one first screen layer includes:
depositing one first screen layer; and
depositing one first screen protection layer;

wherein the first screen layer protects the one or more regions of the second group of regions against the first surface treatment; and wherein the first screen protection layer protects the first screen layer against a process for removing the first screen layer.

2. The process according to claim 1, wherein the selectively removing the at least one first screen layer and the at least one second screen layer from the one or more regions of the second group of regions includes one or more of:
mechanical abrasion;
dry etching;
planarizing etching;
dissolution; and
chemical etching.

3. The process according to claim 2, wherein the selectively removing the at least one first screen layer and the at least one second screen layer from the one or more regions of the second group of regions includes controlling the removal step by monitoring one or more of the following:
- a time period of the removal process;
- a torque measured on a rotating disk during mechanical abrasion; and
- an analysis of some residues of the removed layers.

4. A process for treating a surface portion of a substrate comprising a first group of regions intended to receive a first surface treatment and a second group of regions intended to receive a second surface treatment different from the first surface treatment, the two groups of regions each comprising at least one region and being mutually complementary with respect to the surface portion, the process comprising:
- forming a mask, which differentiates a first group of regions from a second group of regions on a substrate;
- depositing, using the mask; at least one first screen layer formed from first materials deposited on the one or more regions of the second group of regions so as to selectively protect one or more regions of the second group of regions from a first surface treatment;
- applying the first surface treatment to the one or more regions of the first group of regions;
- depositing at least one second screen lever formed from second materials over both the one or more regions of the first group of regions and the one or more regions of the second group of regions to selectively protect one or more regions of the first group of regions against the affects of a second surface treatment;
- selectively removing the at least one first screen layer and the at least one second screen layer from the one or more regions of the second group of regions; wherein the selectively removing the at least one first screen layer and the at least one second screen layer from the one or more regions of the second group of regions comprises:
  - partially removing the second screen layer so that an upper surface of the second screen layer in the one or more regions of the first group of regions is created with the upper surface at a lower level than a level of an interface between the first screen layer and the first screen protection layer in the one or more regions of the second group of regions;
  - depositing at least one second screen protection layer on the one or more regions of the first group of regions;
  - partially removing the first screen protection layer and the second screen protection layer so as to make apparent the first screen layer in the one or more regions of the second group of regions; and
  - removing the first screen layer in the one or more regions of the second group of regions;
- applying the second surface treatment on the one or more regions of the second group of regions;
- wherein the depositing, using a mask, at least one first screen layer includes:
  - depositing one first screen layer; and
  - depositing one first screen protection layer;
- wherein the first screen layer protects the one or more regions of the second group of regions against the first surface treatment; and
- wherein the first screen protection layer protects the first screen layer against a process for removing the first screen lever.

5. The process according to claim 1, wherein the first screen protection layer possesses a second material state with the property of greater resistance during the selectively removing of the at least one first screen layer as compared with the at least one second screen layer.

6. The process according to claim 5, wherein the first screen protection layer possesses a material state with the property that passes from a first state to the second state by a treatment applied in situ.

7. The process according to claim 1, wherein the selectively protecting one or more regions of the second group of regions includes:
- depositing one first screen protection layer which is photosensitive and capable of being developed; and
- irradiating, using the mask, the first screen protection layer.

8. The process according to claim 1, wherein the applying of the first surface treatment and the applying of the second surface treatment include implantation of atomic or ionic species to create respective dopings of the substrate which are different from each another.

9. A semiconductor substrate having a surface treated in accordance with the process according to claim 1.

10. The process according to claim 4, wherein the selectively removing the at least one first screen layer and the at least one second screen layer from the one or more regions of the second group of regions includes one or more of:
- mechanical abrasion;
- dry etching;
- planarizing etching;
- dissolution; and
- chemical etching.

11. The process according to claim 10, wherein the selectively removing the at least one first screen layer and the at least one second screen layer from the one or more regions of the second group of regions includes controlling the removal step by monitoring one or more of the following:
- a time period of the removal process;
- a torque measured on a rotating disk during mechanical abrasion; and
- an analysis of some residues of the removed layers.

12. The process according to claim 4, wherein the first screen protection layer possesses a second material state with the property of greater resistance during the selectively removing of the at least one first screen layer as compared with the at least one second screen layer.

13. The process according to claim 12, wherein the first screen protection layer possesses a material state with the property that passes from a first state to the second state by a treatment applied in situ.

14. The process according to claim 4, wherein the selectively protecting one or more regions of the second group of regions includes:
- depositing one first screen protection layer which is photosensitive and capable of being developed; and
- irradiating, using the mask, the first screen protection layer.

15. Th process according to claim 4, wherein the applying of the first surface treatment and the applying of the second surface treatment include implantation of atomic or ionic species to create respective dopings of the substrate which are different from each another.

* * * * *

UNITED STATES PATENT AND TRADEMARK OFFICE
CERTIFICATE OF CORRECTION

PATENT NO. : 6,797,597 B2
DATED : September 28, 2004
INVENTOR(S) : Paul Ferreira et al.

It is certified that error appears in the above-identified patent and that said Letters Patent is hereby corrected as shown below:

Column 11,
Lines 24 and 64, change "lever" to -- layer --

Column 12,
Line 57, change "Th" to -- The --

Signed and Sealed this

Seventh Day of December, 2004

JON W. DUDAS
*Director of the United States Patent and Trademark Office*